(12) United States Patent
Lee (10) Patent No.: US 11,689,194 B2
(45) Date of Patent: **\*Jun. 27, 2023**

(54) POWER SUPPLY DEVICE FOR PROTECTIVE RELAY

(71) Applicant: LS ELECTRIC CO., LTD., Anyang-si (KR)

(72) Inventor: Young-Joo Lee, Anyang-si (KR)

(73) Assignee: LS ELECTRIC CO., LTD., Anyang-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 17/026,909

(22) Filed: Sep. 21, 2020

(65) Prior Publication Data

US 2021/0006239 A1 Jan. 7, 2021

Related U.S. Application Data

(63) Continuation of application No. 16/244,536, filed on Jan. 10, 2019, now Pat. No. 10,819,329.

(30) Foreign Application Priority Data

Jan. 10, 2018 (KR) ........................ 10-2018-0003080

(51) Int. Cl.
*H03K 17/081* (2006.01)
*H03K 17/082* (2006.01)
(Continued)

(52) U.S. Cl.
CPC .......... *H03K 17/081* (2013.01); *H01H 47/00* (2013.01); *H02H 1/06* (2013.01); *H02H 3/087* (2013.01);
(Continued)

(58) Field of Classification Search
CPC ............ H01H 47/00; H02H 1/00; H02H 1/06; H02H 3/00; H02H 3/087; H02H 9/00;
(Continued)

(56) References Cited

U.S. PATENT DOCUMENTS 5,189,587 A 2/1993 Haun et al.
5,808,847 A 9/1998 Ferrazzi
(Continued)

FOREIGN PATENT DOCUMENTS

CN 2562473 Y 7/2003
CN 205248776 U 5/2016
(Continued)

OTHER PUBLICATIONS

T. J. Drummond, H. Morkoc, K. Lee and M. Shur, "Model for modulation doped field effect transistor," in IEEE Electron Device Letters, vol. 3, No. 11, pp. 338-341, Nov. 1982, doi: 10.1109/EDL.1982.25593.*
(Continued)

*Primary Examiner* — Diana J. Cheng
*Assistant Examiner* — Dave Mattison
(74) *Attorney, Agent, or Firm* — K&L Gates LLP (57) ABSTRACT

The present disclosure relates to a power supply device for a protective relay. The power supply device comprises a power circuit for supplying a power to the control circuit, wherein the power circuit includes: a semiconductor switch element having an input terminal connected to a first node for receiving a direct current, and an output terminal connected to a reference node, wherein the reference node has a voltage lower than a voltage of the first node; and a first voltage drop element disposed between the first node and a second node, wherein the second node is connected to a switching terminal of the semiconductor switch element.

7 Claims, 6 Drawing Sheets

(51) Int. Cl.
*H03K 17/687* (2006.01)
*H02H 9/02* (2006.01)
*H02H 3/087* (2006.01)
*H01H 47/00* (2006.01)
*H02H 1/06* (2006.01)

(52) U.S. Cl.
CPC ............ *H02H 9/025* (2013.01); *H02H 9/026* (2013.01); *H03K 17/0822* (2013.01); *H03K 17/6874* (2013.01); *H03K 2017/6875* (2013.01)

(58) Field of Classification Search
CPC ........ H02H 9/025; H02H 9/026; H03K 17/00; H03K 17/04123; H03K 17/063; H03K 17/081; H03K 17/0822; H03K 17/687; H03K 17/6874; H03K 2017/00; H03K 2017/6875; H03K 2217/00; H03K 2217/0036
USPC ........................................................ 327/427
See application file for complete search history.

(56) References Cited

U.S. PATENT DOCUMENTS

| | | | |
|---|---|---|---|
| 8,422,182 | B2 | 4/2013 | Boudet et al. |
| 8,743,523 | B2 | 6/2014 | Acharya et al. |
| 2009/0146624 | A1 | 6/2009 | Kim et al. |
| 2012/0026632 | A1* | 2/2012 | Acharya ............... H03K 17/081 361/56 |
| 2014/0334047 | A1 | 11/2014 | Ahn | |

FOREIGN PATENT DOCUMENTS

| | | | | |
|---|---|---|---|---|
| JP | S5529970 | | 2/1980 | |
| JP | H04127306 | A | 4/1992 | |
| JP | 2000156930 | A | 6/2000 | |
| JP | 2001218355 | A | 8/2001 | |
| JP | 2008148380 | A | 6/2008 | |
| JP | 2011003293 | A | 1/2011 | |
| JP | 2015225825 | * | 12/2015 | ............... H04N 1/04 |
| JP | 2015225825 | A | 12/2015 | |
| JP | 2016165177 | A | 9/2016 | |
| KR | 100678620 | B1 | 2/2007 | |
| KR | 101232820 | B1 | 2/2013 | |
| KR | 20150130740 | A | 11/2015 | |
| KR | 20160150348 | A | 12/2016 | |
| WO | 2006/129152 | A1 | 12/2006 | |

OTHER PUBLICATIONS

"Field-effect transistor." Wikipedia, Wikimedia Foundation, Nov. 19, 2021, https://en.wikipedia.org/wiki/Field-effect_transistor.*
First Chinese Office Action dated Nov. 12, 2020 in corresponding Chinese Patent Application No. 201910024411.1—7 Pages.
Japanese Office Action for related Japanese Application No. 2019-001359; action dated Jul. 28, 2020; (3 pages).
European Search Report for related European Application No. 19150755.7; action dated Jul. 12, 2019; (6 pages).
Korean Office Action for related Korean Application No. 10-2018-0003080; action dated Jun. 12, 2019; (6 pages).
Japanese Office Action for related Japanese Application No. 2019-001359; action dated Jan. 21, 2020; (5 pages).

* cited by examiner

FIG. 1

-PRIOR ART-

FIG. 2

-PRIOR ART-

POWER SUPPLY DEVICE FOR PROTECTIVE RELAY

CROSS-REFERENCE TO RELATED APPLICATIONS

This application is a continuation application of U.S. application Ser. No. 16/244,536 filed on Jan. 10, 2019, which claims the priority of Korean Patent Application No. 10-2018-0003080, filed on Jan. 10, 2018, in the Korean Intellectual Property Office, the disclosure of which is hereby incorporated by reference in its entirety.

BACKGROUND

1. Technical Field

The present disclosure relates to a power supply device for a protective relay.

2. Description of the Related Art

The protective relay senses a level of an alternating current and compares the current level value with a preset value. The protective relay then generates a trip signal based on the comparison result. Then, the protective relay may prevent a power system accident due to a fault current by activating a circuit breaker based on the trip signal.

Figure 1:
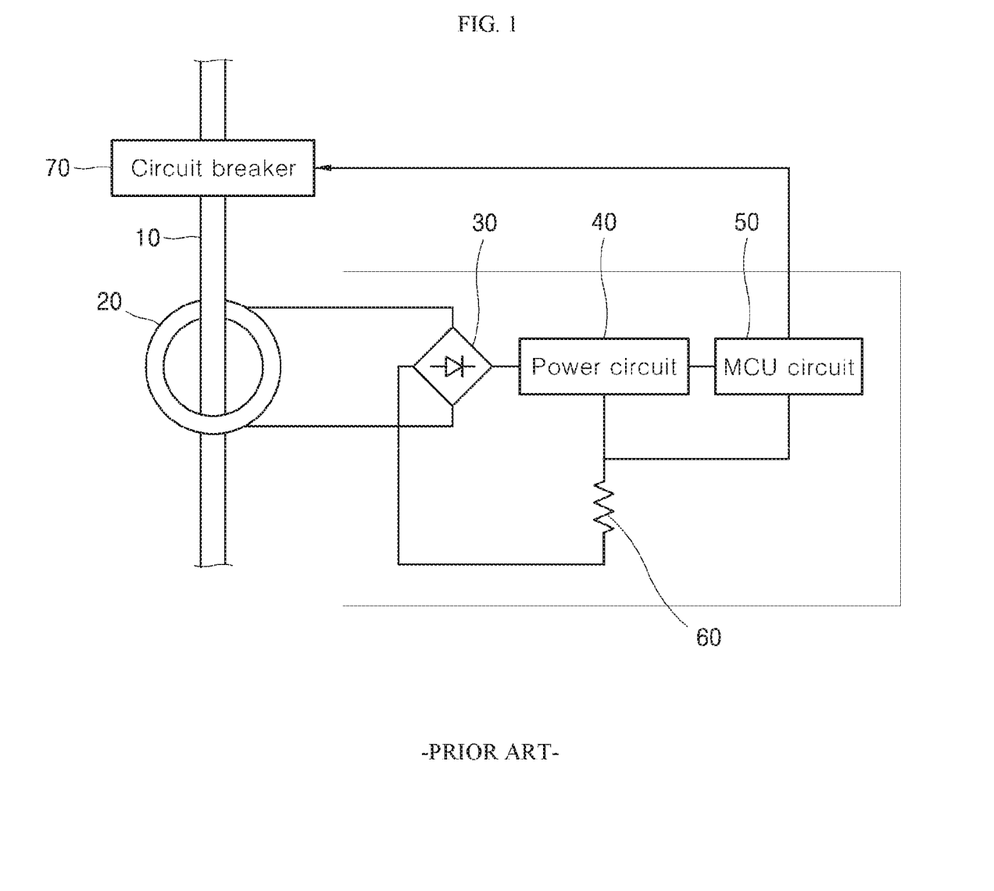
FIG. 1 is a block diagram showing a schematic configuration of a conventional power supply device for a protective relay.
Figure 2:
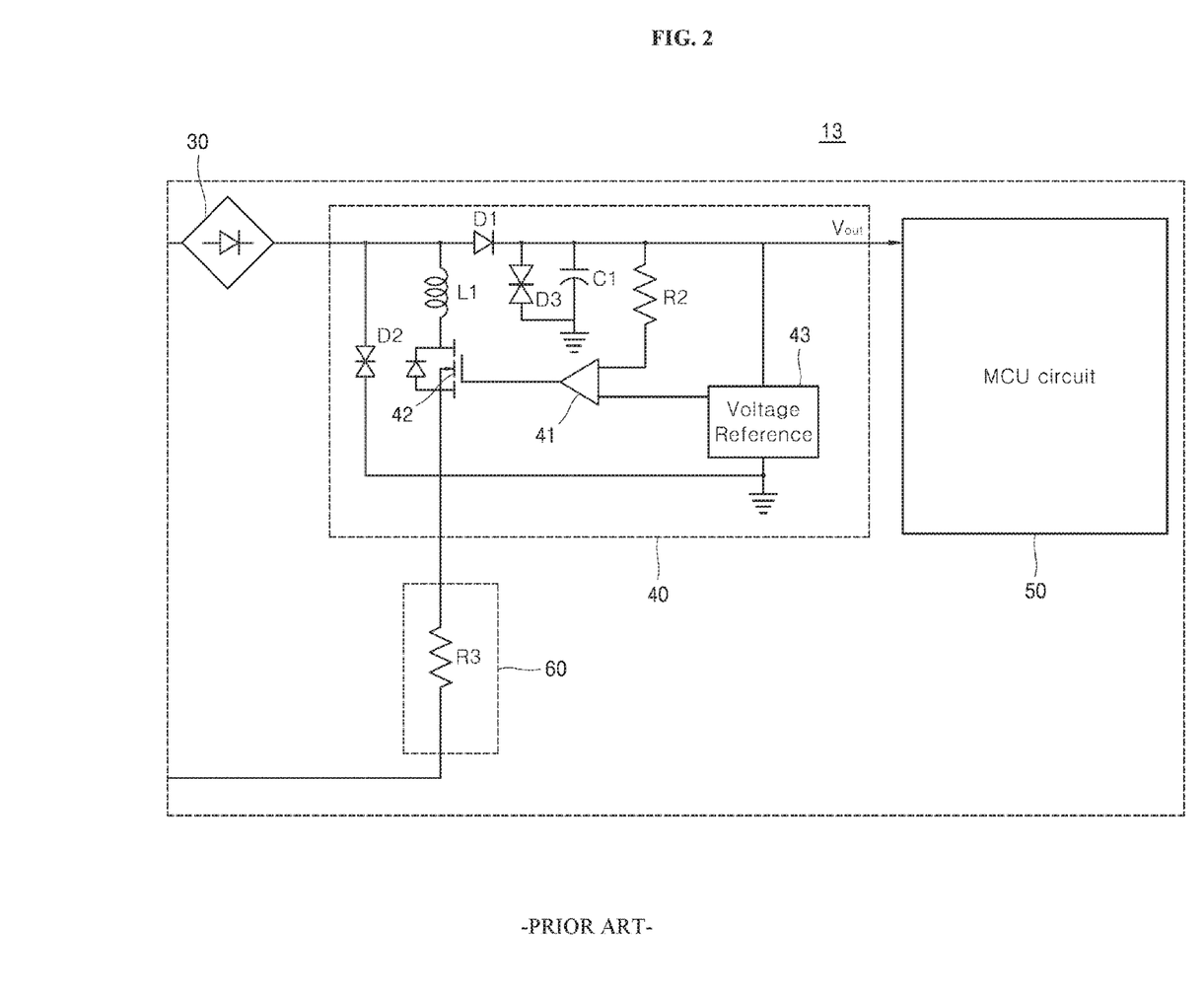
FIG. 2 is a block diagram showing a detailed circuit configuration of the power circuit of FIG. 1.

FIG. 1 is a block diagram showing a schematic configuration of a conventional power supply device for a protective relay. FIG. 2 is a block diagram showing a detailed circuit configuration of the power circuit of FIG. 1.

Referring to FIG. 1, a prior art power supply device for a protective relay includes a current transformer 20, a rectifying circuit 30, a power circuit 40, a control circuit 50, and a circuit breaker 70.

The current transformer 20 is installed on a power line 10 of the power system and detects an amount of current flowing through the power line 10.

The rectifying circuit 30 rectifies the AC current input from the current transformer 20 into a DC current. The rectifying circuit 30 may include a conventional bridge diode, but the present disclosure is not limited thereto.

The power circuit 40 prevents a voltage to be supplied to the control circuit 50 from rising above a certain level. A detailed configuration of the power circuit 40 will be described later with reference to FIG. 2.

The control circuit 50 determines whether an accident occurs in the power system using a detected current or voltage on the power system. The control circuit 50 outputs a breaking control signal for controlling an operation of the circuit breaker 70.

A measurement resistor 60 functions to convert a current signal detected by the current transformer 20 into a voltage signal proportional to the current signal.

The circuit breaker 70 performs an operation to break the power line 10. The circuit breaker 70 may be controlled by the breaking control signal output from the control circuit 50.

Referring to FIG. 2, the power circuit 40 includes a comparison circuit 41, a switching element 42 which is on/off-controlled by the comparison circuit 41, and a reference-voltage generator 43.

The comparison circuit 41 compares the reference voltage input from the reference-voltage generator 43 with an output voltage of the power circuit 40 provided from a resistor R2.

When the output voltage of the power circuit 40 is larger than the reference voltage, the comparison circuit 41 outputs a control signal for turning on the switching element 42. When the output voltage is smaller than the reference voltage, the comparison circuit 41 outputs a control signal for turning off the switching element 42.

When the rectifying circuit 30 receives the AC current from the current transformer 20 (FIG. 1) and outputs the rectified DC current, the DC current is smoothed to a constant DC voltage via charge and discharge of a capacitor C1. The smoothed DC voltage is applied to the control circuit 50 as the output voltage Vout of the power circuit 40.

In this connection, when a power consumption of the control circuit 50 is not large, the output voltage Vout rises above an operating voltage of the control circuit 50. In this case, the output voltage Vout of the power circuit 40 provided from a second resistor R2 is higher than the reference voltage input from the reference-voltage generator 43. Thus, the comparison circuit 41 outputs the control signal for turning on the switching element 42.

Then, when the switching element 42 is turned on, the direct current from the rectifying circuit 30 flows to a reference node through the switching element 42, while no current flows into the control circuit 50. Accordingly, the output voltage Vout of the power circuit 40 becomes smaller than the reference voltage.

Then, when the output voltage Vout becomes smaller than the reference voltage, the comparison circuit 41 outputs the control signal for turning off the switching element 42. As the switching element 42 is turned off, the DC current flows again to the control circuit 50.

When repeating such a process, a constant DC voltage that does not exceed the operating voltage of the control circuit 50 is supplied.

However, in such a conventional power supply device, ripple noise is inevitably generated at a moment when the switching element 42 switches. To eliminate such switching noise, a low-pass filter (LPF) may be used. However, such a filter may not completely remove the noise. Further, due to the switching noise, an accuracy of measurement of the power system by the control circuit 50 is reduced.

SUMMARY

An purpose of the present disclosure is to provide a power supply device having a circuit capable of eliminating the switching noise generated in the power circuit, thereby providing a stable power supply to the control circuit.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided a power supply device capable of providing a stable power to a control circuit, wherein the control circuit controls a circuit breaker connected to a power system, wherein the power supply device comprises a power circuit for supplying a power to the control circuit, wherein the power circuit includes: a semiconductor switch element having an input terminal connected to a first node for receiving a direct current, and an output terminal connected to a reference node, wherein the reference node has a voltage lower than a voltage of the first node; and a first voltage drop element disposed between the first node and a second node, wherein the second node is connected to a switching terminal of the semiconductor switch element.

In one embodiment, the power circuit further includes a capacitor disposed between the second node and the reference node.

In one embodiment, when a voltage higher than a first breakdown voltage is applied across the first voltage drop element, the first voltage drop element electrically conducts to charge the capacitor.

In one embodiment, the power circuit further includes a second voltage drop element disposed between the second node and the reference node.

In one embodiment, when a voltage higher than the second breakdown voltage is applied across the second voltage drop element, the second voltage drop element electrically conducts to allow a gate voltage applied to the second node to be kept below the second breakdown voltage.

In one embodiment, the second breakdown voltage is lower than an allowable maximum gate threshold voltage at the switching terminal of the semiconductor switch element.

In one embodiment, the power supply device further comprises a rectifying circuit, wherein when a current transformer detects a current flowing in an electrical line of the power system, the rectifying circuit receives an alternating current from the current transformer and rectifies the alternating current to a direct current and supplies the rectified direct current to the power circuit.

In one embodiment, the semiconductor switching element is configured to: when a gate voltage applied to the switching terminal rises, increase a magnitude of a current flowing from the first node to the reference node; when the gate voltage applied to the switching terminal drops, decrease the magnitude of the current flowing from the first node to the reference node.

In one embodiment, when a magnitude of the direct current input to the power circuit increases, the gate voltage applied to the switching terminal rises, wherein when the magnitude of the direct current input to the power circuit decreases, the gate voltage applied to the switching terminal drops.

In one embodiment, the power circuit further includes a current-limiting resistor disposed between the first voltage drop element and the first node.

In one embodiment, the semiconductor switch element includes a metal oxide semiconductor field effect transistor (MOSFET), a power transistor, a thyristor, or an insulated gate bipolar transistor (IGBT).

In one embodiment, each of the first and second voltage drop elements and includes a Zener diode.

The power supply device according to the present disclosure eliminates the switching noise generated in the power circuit, thereby providing stable voltage and current to the control circuit. As a result, a precision of measurement by the control circuit may be improved, and an operation reliability may also be improved.

Further, the power supply device according to the present disclosure simplifies a structure of the power circuit, thereby reducing a size of the power circuit, which can further reduce a manufacturing cost thereof.

Further specific effects of the present disclosure as well as the effects as described above will be described in conduction with illustrations of specific details for carrying out the invention.

DETAILED DESCRIPTION

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, a power supply device for a protective relay according to an embodiment of the present disclosure will be described in detail with reference to FIGS. 3 to 6.

Figure 3:
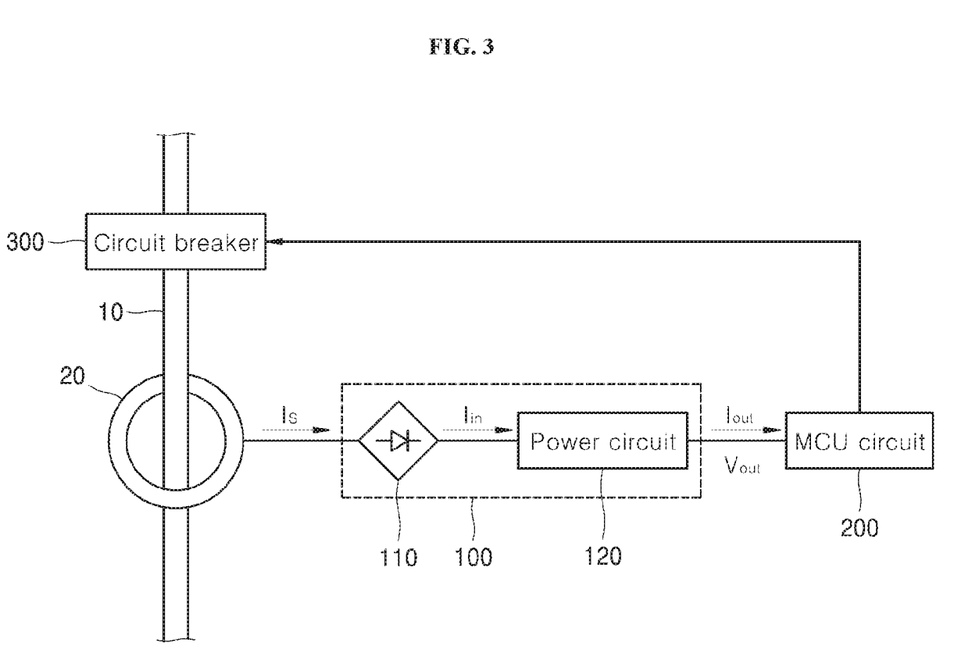
FIG. 3 is a block diagram of a power supply device for a protective relay according to an embodiment of the present disclosure.

FIG. 3 is a block diagram of a power supply device for a protective relay according to an embodiment of the present disclosure.

Referring to FIG. 3, a protective relay according to an embodiment of the present disclosure includes a rectifying circuit 110, a power circuit 120, a control circuit 200, and a circuit breaker 300.

The current transformer 20 is installed in a power line 10 of the power system and detects an amount of current flowing through the power line 10.

The rectifying circuit 110 rectifies the alternating current received from the current transformer 20 to a direct current and outputs the rectified direct current. The rectifying circuit 110 may employ a conventional bridge diode. The present disclosure is not limited thereto.

However, when the power system is a DC power system, the current transformer 20 and the rectifying circuit 110 may be omitted. The power circuit 120 maintains a power supplied to the control circuit 200 to be constant.

Specifically, the power circuit 120 may maintain a magnitude of each of an output voltage Vout and an output current Iout to be provided to the control circuit 200 to be constant. Further, the power circuit 120 may not generate ripple noise due to switching. Thus, the power circuit 120 can provide a stable voltage and current to the control circuit 200. A detailed structure of the power circuit 120 will be described later with reference to FIG. 4.

The control circuit 200 determines whether an accident has occurred in the power system based on a detected current or a detected voltage on the power system. Based on the determination result, the control circuit 220 outputs a breaking control signal for controlling an operation of the circuit breaker 300. In this regard, the control circuit 200 may receive a stable operating power from the power circuit 120. Accordingly, an accuracy of measurement of the power system by the control circuit 200 can be improved, and an operational reliability of the control circuit 200 can be improved.

The circuit breaker 300 breaks a path of the power line 10. Specifically, an operation of the circuit breaker 300 may be controlled by a breaking control signal output from the control circuit 200.

That is, the protective relay according to the present disclosure detects the current or voltage of the power system. When the relay determines, based on the detected current or voltage, that an over-power, a low-power, an over-voltage and a low-voltage, a over-power factor, a low-power factor, a over-current, an open-phase, a reverse-phase, an unbalance, a ground fault, or short circuit is generated in the power system, the relay may activate a protection function to break the power to be supplied to a load.

The power supply device 100 for a protective relay according to an embodiment of the present disclosure may include a rectifying circuit 110 and a power circuit 120. Hereinafter, the components of the power supply device 100 will be described in detail.

Figure 4:
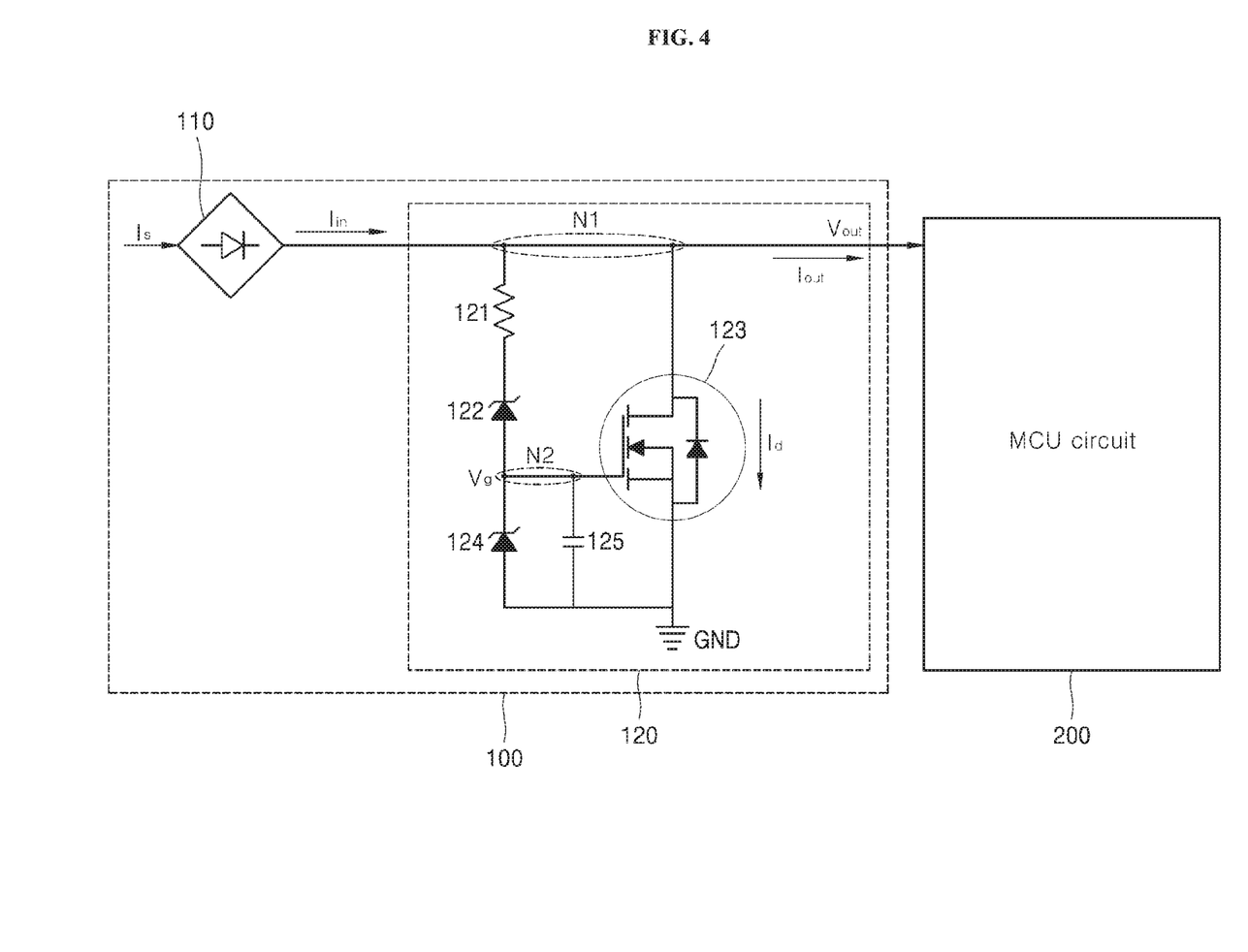
FIG. 4 is a circuit diagram of the power supply device in FIG. 3.
Figure 5:
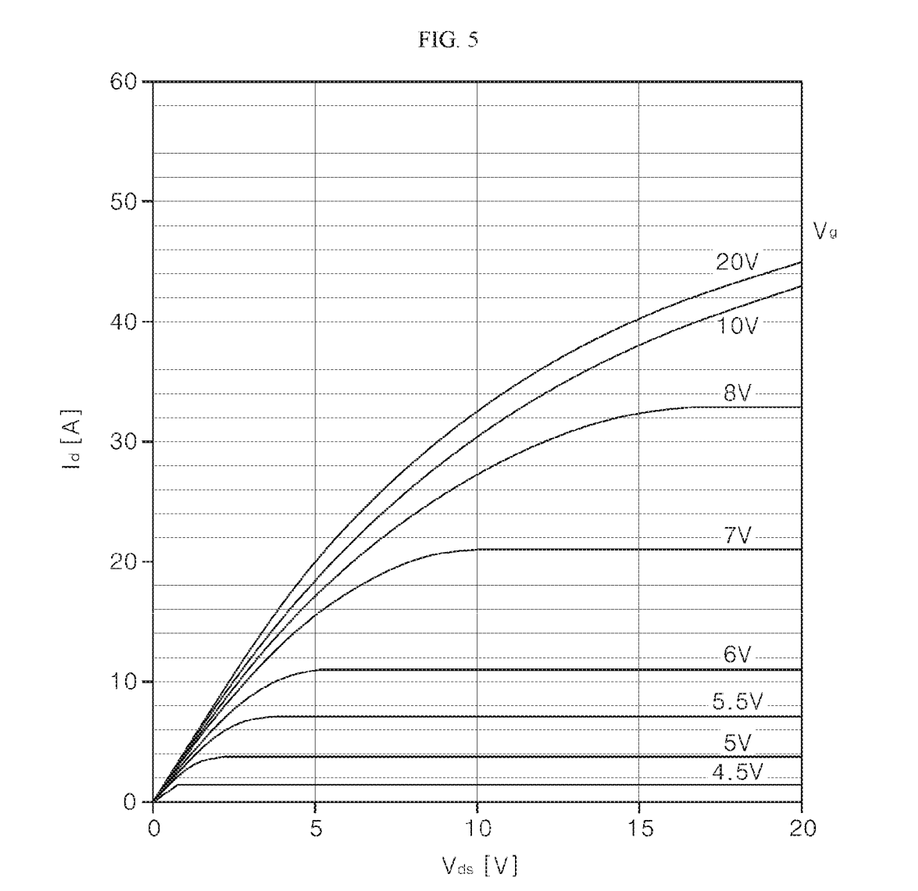
FIG. 5 is a graph illustrating operating characteristics of a semiconductor switching element of FIG. 4.
Figure 6:
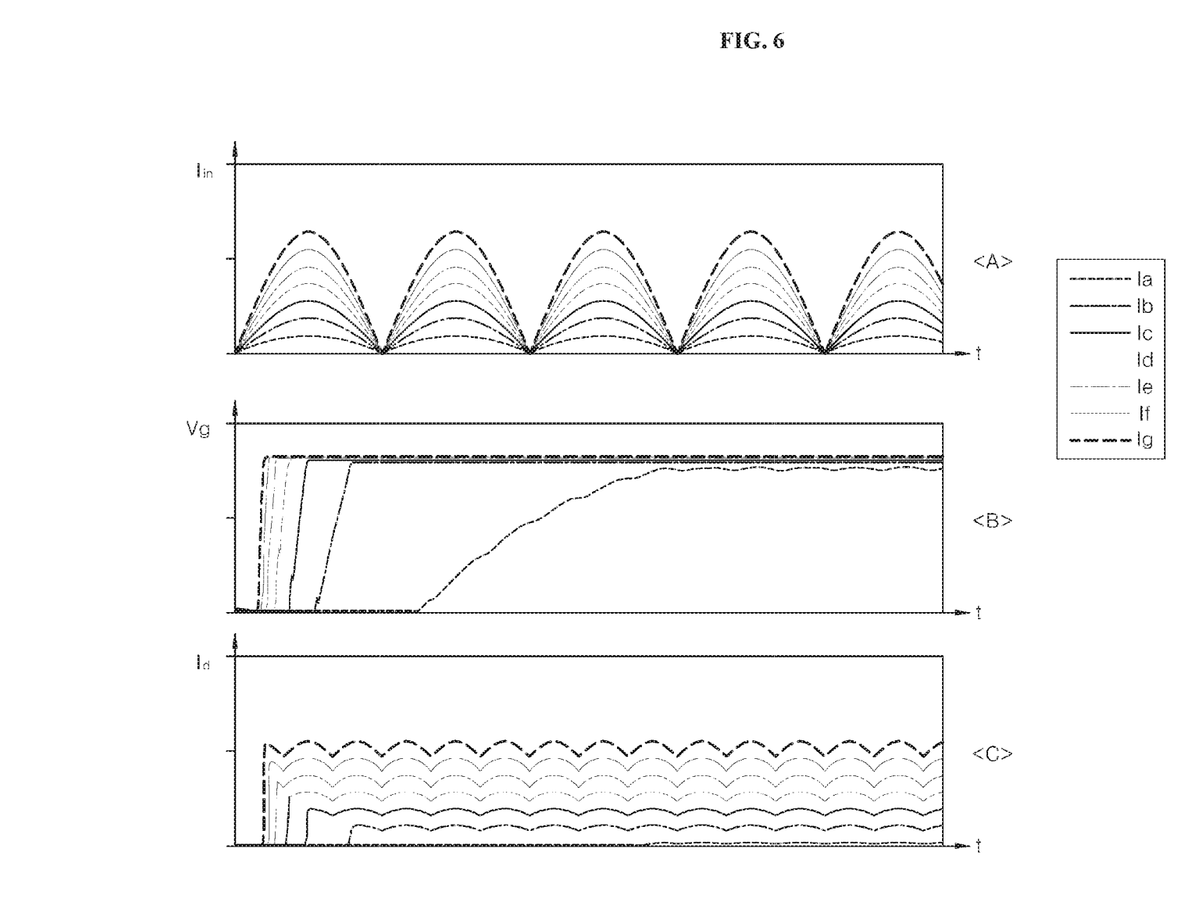
FIG. 6 is a graph illustrating an operation of the power supply device for a protective relay according to an embodiment of the present disclosure.

FIG. 4 is a circuit diagram of the power supply device in FIG. 3. FIG. 5 is a graph illustrating operating characteristics of a semiconductor switching element of FIG. 4. FIG. 6 is a graph illustrating an operation of the power supply device for a protective relay according to an embodiment of the present disclosure.

Referring to FIG. 4, the power supply device 100 according to an embodiment of the present disclosure includes a rectifying circuit 110 and a power circuit 120.

The rectifying circuit 110 receives the AC current Is from the current transformer 20, rectifies the AC current Is into a DC current Iin, and outputs the rectified DC current Iin.

The rectifying circuit 110 provides the rectified DC current Iin to the power circuit 120. The rectifying circuit 110 may include a conventional bridge diode. The present disclosure is not limited thereto.

The power circuit 120 includes a first voltage drop element 122, a semiconductor switch element 123, and a capacitor 125. In addition, the power circuit 120 may further include a current-limiting resistor 121 disposed between a first node N1 and the first voltage drop element 122, and a second voltage drop element 124 disposed between a second node N2 connected to a switching terminal of the semiconductor switch element 123 and a reference node GND.

The present disclosure is not limited to the above configuration. The current-limiting resistor 121 and the second voltage drop element 124 are additional functional elements for protecting the power supply device according to the present disclosure from an overcurrent or an overvoltage. Accordingly, the current-limiting resistor 121 and the second voltage drop element 124 may be omitted in some cases.

The first voltage drop element 122 is disposed between the first node N1 and the second node N2 connected to the switching terminal of the semiconductor switch element 123. The first voltage drop element 122 may be used to generate a reference voltage for the power to be provided to the control circuit 200.

Specifically, the first voltage drop element 122 has a first breakdown voltage. When a voltage greater than the first breakdown voltage is applied across the first voltage drop element 122, the first voltage drop element 122 is turned on to apply a voltage to the second node N2. In this case, the voltage applied to the second node N2 charges the capacitor 125. Thus, the second node N2 is maintained at a specific voltage. In this connection, the first voltage drop element 122 may employ a Zener diode, but the present disclosure is not limited thereto.

The semiconductor switch element 123 is disposed between the first node N1 and the reference node GND. Specifically, an input terminal of the semiconductor switch element 123 is connected to the first node N1. An output terminal of the semiconductor switch element 123 is connected to the reference node GND. The switching terminal of the semiconductor switch element 123 is connected to the second node N2.

Referring to FIG. 5, FIG. 5 shows a Id to Vds correlation curve based on a change in a gate voltage Vg of the semiconductor switch element 123. When the gate voltage Vg in the semiconductor switch element 123 increases, a magnitude of a drain current Id flowing from the input terminal to the output terminal increases. Further, when a source-drain voltage Vds increases, the magnitude of the drain current Id flowing from the input terminal to the output terminal increases.

The semiconductor switch element 123 may be composed of a semiconductor switch including a metal oxide semiconductor field effect transistor (MOSFET), a thyristor, and an insulated gate bipolar transistor (IGBT). However, this is only a few examples. The present disclosure is not limited thereto.

The operation of the semiconductor switch element 123 will be described later in detail.

Referring again to FIG. 4, the second voltage drop element 124 may be disposed between the second node N2 and the reference node GND. The second voltage drop element 124 may be connected in parallel with the capacitor 125. In this connection, the second voltage drop element 124 may employ a Zener diode, but the present disclosure is not limited thereto.

The second voltage drop element 124 has a second breakdown voltage to protect the semiconductor switch element 123. In this regard, the second breakdown voltage may be smaller than a maximum gate threshold voltage allowed at the switching terminal of the semiconductor switch element 123. When a voltage across the second voltage drop element 124 is greater than the second breakdown voltage, the second voltage drop element 124 is turned on.

Therefore, the voltage of the second node N2, that is, the gate voltage Vg of the semiconductor switch element 123, does not exceed the second breakdown voltage. Thus, the second voltage drop element 124 is configured such that a voltage not exceeding the maximum gate threshold voltage is applied to the switching terminal of the semiconductor switch element 123. As a result, the semiconductor switch element 123 may be protected.

The capacitor 125 is connected in parallel with the second voltage drop element 124. That is, the capacitor 125 is disposed between the second node N2 and the reference node GND. When the first voltage drop element 122 conducts, the capacitor 125 is charged by a current applied thereto. The voltage of the second node N2 does not exceed the second breakdown voltage of the second voltage drop element 124.

If the voltage charged in the capacitor 125 exceeds the second breakdown voltage, the second voltage drop element 124 conducts such that a current additionally applied to the capacitor 125 flows to the reference node GND. Therefore, the capacitor 125 may continuously receive a voltage not exceeding the second breakdown voltage, and the semiconductor switch element 123 may continue to be turned on to operate in a normal range.

However, the second voltage drop element 124 and the capacitor 125 are not essential components in the power circuit 120. Other embodiments of the present disclosure may be implemented by omitting both components, that is, the second voltage drop element 124 and the capacitor 125. In another example, only one of the two components may be included in the power circuit 120.

Hereinafter, the operation of the power supply device for the protective relay according to the embodiment of the present disclosure will be described with reference to FIG. 4 and FIG. 6.

In FIG. 6, <A> represents the DC current Iin output from the rectifying circuit 110. <B> represents the gate voltage Vg of the semiconductor switch element 123. <C> represents the drain current Id flowing through the semiconductor switch element 123. In this connection, lines of the same type (e.g., Ia, Ib, Ic) refer to values measured under the same condition.

First, the direct current Iin supplied from the rectifying circuit 110 may be expressed as a specific voltage due to a constant load of the power circuit 120 and the control circuit 200. In this connection, when the current supplied from the rectifying circuit 110 gradually increases, a voltage across the first voltage drop element 122 increases.

When the voltage across the first voltage drop element 122 continues to rise above the first breakdown voltage of the first voltage drop element 122, the first voltage drop element 122 conducts to charge the capacitor 125. That is, the current Iin supplied from the rectifying circuit 110 is supplied to the capacitor 125, such that the capacitor 125 is charged.

When the voltage across the charged capacitor 125 (i.e., the voltage of the second node N2) exceeds a gate threshold voltage of the semiconductor switch element 123, the semiconductor switch element 123 is turned on.

In this connection, the second breakdown voltage of the second voltage drop element 124 for protection of the semiconductor switch element 123 is set to be lower than the allowable maximum gate threshold voltage of the semiconductor switch element 123. Thus, the second voltage drop element 124 may protect the semiconductor switch element 123 from an overvoltage.

When a voltage higher than the second breakdown voltage is applied to the second voltage drop element 124, the second voltage drop element 124 is turned on. Thus, the current flowing in the capacitor 125 is diverted to the reference node (for example, ground (GND)), such that the voltage applied to the switching terminal (i.e., second node N2) of the semiconductor switch element 123 is maintained at a value below the second breakdown voltage.

As the semiconductor switch element 123 is turned on, the current Iin supplied from the rectifying circuit 110 is divided such that a partial current thereof will pass through the reference node GND, such that only a constant magnitude of current is supplied to the control circuit 200.

Accordingly, the DC voltage Vout supplied to the control circuit 200 may be limited to have a constant magnitude. In this connection, the magnitude of the DC voltage Vout is limited to a sum of magnitudes of the voltage across the second node N2, the first breakdown voltage of the first voltage drop element 122, and the voltage dropped by the current-limiting resistor 121.

When a magnitude of the current received from the current transformer 20 increases, a magnitude of the direct current Iin received from the rectifying circuit 110 is increased. Thus, the magnitude of the DC voltage Vout supplied to the control circuit 200 may be increased. In this case, a current flowing in the first voltage drop element 122 also increases, such that the gate voltage Vg of the semiconductor switch element 123 (i.e., the voltage of the second node N2) rises.

According to the I-V characteristic curve of semiconductor switch element 123 (FIG. 5), the current Id flowing through the semiconductor switch element 123 rises as the gate voltage Vg applied to the semiconductor switch element 123 rises. Therefore, an increment in the direct current Iin passes through the semiconductor switch element 123 to the reference node GND, while the magnitude of the direct current Tout supplied to the control circuit 200 is kept constant.

Conversely, when the magnitude of the current input from the current transformer 20 becomes smaller, the magnitude of the DC current Iin input from the rectifying circuit 110 becomes smaller. When the magnitude of the direct current Iin becomes smaller, the gate voltage Vg applied to the semiconductor switch element 123 decreases. Thus, the current Id flowing through the semiconductor switch element 123 decreases while the DC current Tout supplied to the control circuit 200 is kept constant.

A repetition of such operations may allow the power supply device 100 according to the present disclosure to supply a constant DC voltage or DC current to the control circuit 200 even when the magnitude of the current input from the current transformer 20 varies. In this regard, the semiconductor switch element 123 always maintains the turned-on state without repeating the switching operation, such that a constant DC power without the ripple noise due to the switching operation is supplied to the control circuit 200.

As shown in FIG. 6, using the power supply device 100 according to the present disclosure may lead to following features: although the magnitude of the DC current Iin input from the rectifying circuit 110 varies (see <A>), the gate voltage Vg of the semiconductor switch element 123 is kept substantially constant (see <B>); further, as the magnitude of the DC current Iin increases or decreases, the drain current Id of the semiconductor switch element 123 increases or decreases in proportion thereto (see <C>), such that the voltage Vout and the current Tout input to the control circuit 200 are kept constant.

Thus, the power supply device 100 in accordance with the present disclosure may eliminate the switching noise generated in the conventional power circuit (40 in FIG. 1) and may provide stable voltage and current to the control circuit 200. As a result, the accuracy of the measurement by the control circuit 200 may be improved, and the operational reliability of the control circuit 200 may also be improved.

Further, the power supply device 100 in accordance with the present disclosure simplifies the structure of the power circuit 120, thereby reducing a size of the power circuit 120, thereby reducing a manufacturing cost thereof.

It is evident to those of ordinary skill in the art to which the present disclosure belongs that the above-described present disclosure is not limited to the above-described embodiments and the accompanying drawings, since various substitutions, modifications, and changes may be made without departing from a technical idea of the present disclosure.

What is claimed is:

1. A power supply device capable of providing a stable power to a control circuit, wherein the control circuit is configured to control a circuit breaker connected to a power system, wherein the power supply device comprises a power circuit for supplying a power to the control circuit, wherein the power circuit includes:
- a semiconductor switch element having an input terminal connected to a first node for receiving a direct current, and an output terminal connected to a reference node, wherein the reference node has a voltage lower than a voltage of the first node;
- a current-limiting resistor disposed between the first node and a second node;
- a first voltage drop element disposed between the current-limiting resistor and the second node, wherein the second node is connected to a switching terminal of the semiconductor switch element;
- a second voltage drop element disposed between the second node and the reference node, wherein the second voltage drop element is connected in series with the first voltage drop element and the current-limiting resistor between the first node and the reference node; and
- a capacitor disposed between the second node and the reference node, wherein the capacitor is connected in parallel with the second voltage drop element, wherein the semiconductor switching element is configured to:
- when a gate voltage applied to the switching terminal rises, increase a magnitude of a current flowing from the first node to the reference node, and
- when the gate voltage applied to the switching terminal drops, decrease the magnitude of the current flowing from the first node to the reference node, and wherein when a voltage higher than a first breakdown voltage is applied across the first voltage drop element, the first voltage drop element electrically conducts to charge the capacitor, and wherein when a charge voltage charged in the capacitor exceeds a second breakdown voltage to protect the semiconductor switch element:
- the second voltage drop element conducts such that a current additionally applied to the capacitor flows to the reference node,
- the capacitor continuously receives a voltage not exceeding the second breakdown voltage, and
- the semiconductor switching element continues to be turned on to operate in a normal range.

2. The power supply device of claim 1, wherein when a voltage higher than the second breakdown voltage is applied across the second voltage drop element, the second voltage drop element electrically conducts to allow the gate voltage applied to the second node to be kept below the second breakdown voltage.

3. The power supply device of claim 2, wherein the second breakdown voltage is lower than an allowable maximum gate threshold voltage at the switching terminal of the semiconductor switch element.

4. The power supply device of claim 1, wherein when a magnitude of the direct current input to the power circuit increases, the gate voltage applied to the switching terminal rises, wherein when the magnitude of the direct current input to the power circuit decreases, the gate voltage applied to the switching terminal drops.

5. The power supply device of claim 1, wherein the power circuit further includes a current-limiting resistor disposed between the first voltage drop element and the first node.

6. The power supply device of claim 1, wherein the semiconductor switch element includes a metal oxide semiconductor field effect transistor (MOSFET), a power transistor, a thyristor, or an insulated gate bipolar transistor (IGBT).

7. The power supply device of claim 1, wherein each of the first voltage drop element and the second voltage drop element includes a respective Zener diode.

* * * * *